United States Patent [19]

Davis

[11] Patent Number: 4,716,379

[45] Date of Patent: Dec. 29, 1987

[54] DIFFERENTIAL AMPLIFIER INCLUDING BALANCED TWO TERMINAL SERIES RC NETWORK

[75] Inventor: William F. Davis, Tempe, Ariz.

[73] Assignee: Motorola, Inc., Schaumburg, Ill.

[21] Appl. No.: 880,472

[22] Filed: Jun. 30, 1986

[51] Int. Cl.[4] ........................... H03F 3/45; H03F 3/14
[52] U.S. Cl. ..................................... 330/252; 330/307
[58] Field of Search ............... 330/252, 254, 303, 304, 330/305, 306, 307; 357/34, 37, 51

[56] References Cited

U.S. PATENT DOCUMENTS

| | | | |
|---|---|---|---|
| 3,408,533 | 10/1968 | Gates | 330/305 X |
| 4,365,208 | 12/1982 | Harford | 330/307 X |
| 4,468,627 | 8/1984 | Fushiki | 330/304 X |
| 4,626,881 | 12/1986 | Kishi et al. | 330/307 X |

Primary Examiner—Eugene R. LaRoche
Assistant Examiner—Steven J. Mottola
Attorney, Agent, or Firm—Vincent B. Ingrassia

[57] ABSTRACT

A differential amplifier manufactured in integrated circuit form in a semiconductor substrate includes first and second differentially coupled input transistors. The emitters of the input transistors are coupled to a first source of supply voltage (e.g. $V_{cc}$) and the collectors of the input transistors are coupled via load devices to a second source of supply voltage (e.g. ground). An RC gain reduction network is provided between the collectors of the input transistors and implemented in such a manner so as to provide substantially equal parasitic capacitances at the collectors of each of the input devices.

6 Claims, 6 Drawing Figures

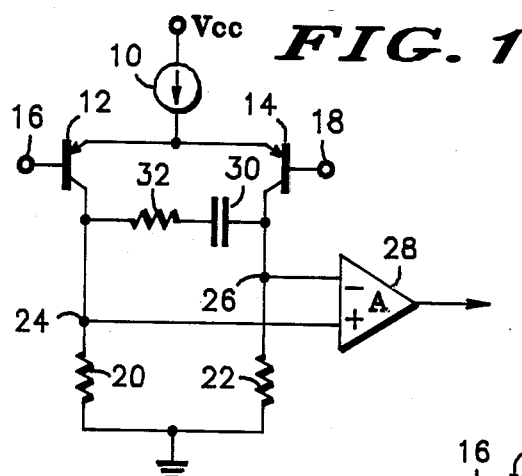
FIG. 1
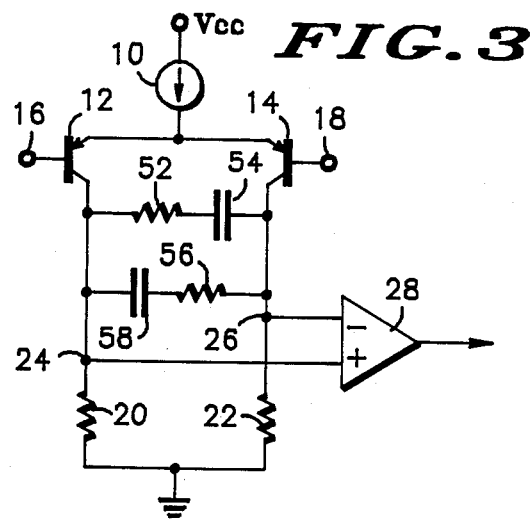
FIG. 3
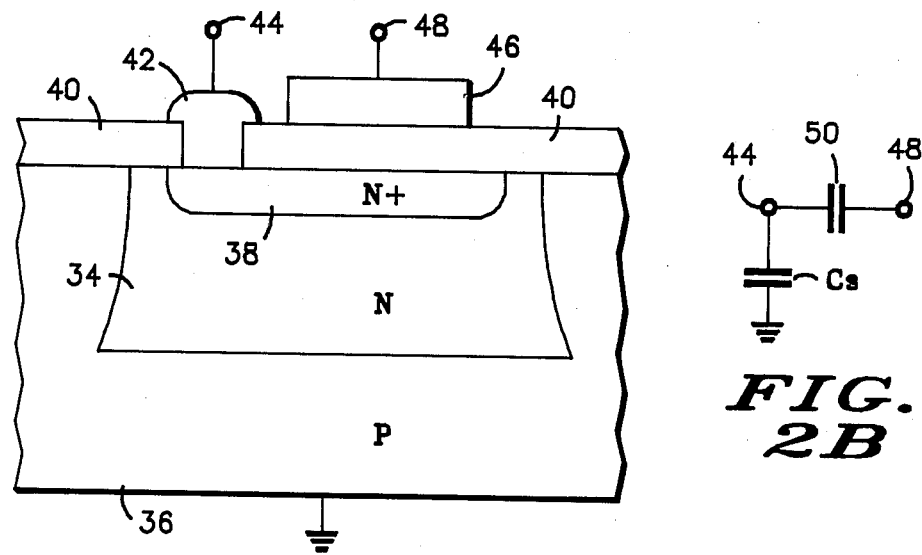
FIG. 2A
FIG. 2B

DIFFERENTIAL AMPLIFIER INCLUDING BALANCED TWO TERMINAL SERIES RC NETWORK

BACKGROUND OF THE INVENTION

This invention relates generally to differential amplifiers and, more particularly, to a differential amplifier including first and second differential input transistors wherein a balanced RC gain reduction network is coupled between the collectors of the input transistors so as to create a symmetrical parasitic capacitance.

U.S. patent application Ser. No. 880,251 filed 6/30/86 entitled AMPLIFIER HAVING IMPROVED GAIN-BANDWIDTH PRODUCT and filed of even date herewith disloses an amplifier wherein a series RC network is coupled between the collectors of the differential input transistors so as to provide a gain reduction and therefore improve the gain bandwidth product. Unfortunately, the inclusion of such an RC network produces an undesirable parasitic capacitance on one side of the amplifier thus producing nonsymmetrical loading on the amplifier and destroying its balanced state. This is undesirable for several reasons. For example, the parasitic capacitance ($C_S$) on one side of the amplifier will cause the AC gain of that side to roll off with frequency relative to the other side. Additionally, a one sided parasitic capacitance will cause any symmetrical base-collector signals to produce an unwanted differential signal across the collectors which is supplied to the second stage and amplified thereby.

SUMMARY OF THE INVENTION

It is an object of the invention to provide an improved differential amplifier.

It is a further object of the invention to provide an improved differential amplifier which includes a gain reduction RC series network which does not destroy the symmetry of the amplifier.

It is a still further object of the present invention to provide a monolithically integrable RC network which, due to its configuration, produces equal parasitic capacitance on both sides thereof.

According to a broad aspect of the invention there is provided a monolithically integrable amplifier circuit manufactured in conjunction with a semiconductor substrate comprising first and second differentially coupled input transistors each having emitters for coupling to a first source of supply voltage, each having a base for coupling to first and second input signals respectively, and each having a collector. First and second load devices are coupled between the collectors of the input transistors and a second source of supply voltage. Gain reduction means comprised of an RC network is coupled between the collectors of the first and second input transistors. This RC network includes a first resistor diffused in the substrate and having first and second terminals, the first terminal being coupled to the collector of the first input transistor. A second resistor, having first and second terminals, is diffused into the substrate and its second terminal is coupled to the collector of the second input transistor. A first capacitor is provided having a first diffused plate formed in the substrate and connected to the collector of the first transistor, and a second capacitor has a first diffused plate formed in the substrate and is connected to the collector of the second transistor. The first capacitor has a second plate comprised of a metal layer insulatingly disposed over the first diffused plate of the first capacitor and is connected to the first terminal of the second resistor. The second capacitor has a second plate comprised of a metal layer insulatingly disposed over the first diffused plate of the second capacitor and is connected to the second terminal of the first resistor.

The above, and other objects, features and advantages of the present invention will be more clearly understood from the following detailed description taken in conjunction with the accompanying drawings, in which:

BRIEF DESCRIPTION OF THE DRAWINGS

FIG. 1 is a schematic diagram of a differential amplifier including a gain reduction RC series network;

FIGS. 2A and 2B illustrate how the implementation of the capacitor shown in FIG. 1 in silicon produces an unwanted parasitic capacitance between one terminal of the capacitor to be constructed and the substrate;

FIG. 3 is a schematic diagram of a differential amplifier in accordance with the present invention;

DESCRIPTION OF THE PREFERRED EMBODIMENT

Figure 4:
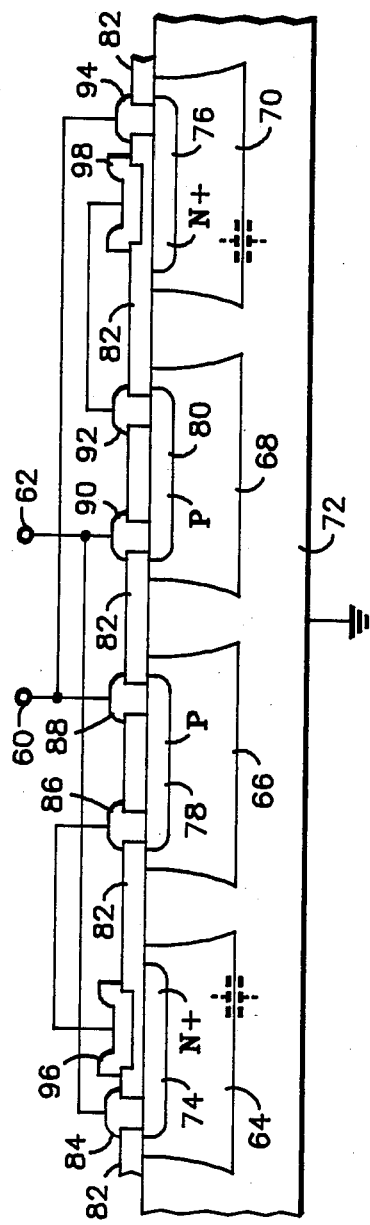
FIG. 4 illustrates the inventive implementation in silicon of the RC gain reduction circuit shown in FIG. 3.

FIG. 1 is a schematic diagram of a differential amplifier of the type shown and described in the above copending application. As can be seen, a current source 10 is coupled between a source of supply voltage $V_{CC}$ and the emitters of first and second input transistors 12 and 14 respectively. The bases of transistors 12 and 14 are coupled to input terminals 16 and 18 respectively for receiving a differential signal thereon, and the collectors of transistors 12 and 14 are coupled via loads 20 and 22 respectively to a second source of supply voltage (e.g. ground). A differential output is taken from nodes 24 and 26 and applied to the second stage 28 of the amplifier in the well known manner. A gain reduction circuit comprised of the series combination of capacitor 30 and resistor 32 is coupled across the collectors of transistors 12 and 14 so as to bring about an improvement in the gain bandwidth product as described in the above cited copending application. Unfortunately, the straight forward implementation of this circuit in silicon produces the unwanted creation of a one sided parasitic capacitance as is illustrated in FIGS. 2A and 2B.

Referring to FIG. 2A, a capacitor may be manufactured by producing an N-type epitaxial region 34 in a P-type substrate 36 which is coupled to ground. An N+ region 38 is then diffused into epitaxial region 34 and comprises one plate of the capacitor to be produced. Next, an oxide layer 40 (e.g. silicon dioxide) is deposited on the surface of the substrate and a window opened in accordance with well known techniques in order that plate 38 may be contacted by contact material 42 (e.g. aluminum). Terminal 44 coupled to contact material 42 forms one terminal of the capacitor. A metal plate 46 is deposited on insulating layer 40 over diffused region 38 and forms the second plate of the capacitor. This plate is coupled to terminal 48. As is well known, in such a structure, the PN junction between epitaxial region 34 and substrate 36 has a parasitic capacitance ($C_S$) associated with all along the junction. The resulting structure is shown schematically in FIG. 2B. That is, in addition to capacitor 50 being formed having terminals 44 and 48, a parasitic capacitance $C_S$ is formed between terminal 44 and ground. Should capacitor 30 in FIG. 1 be manufactured in this manner, the result is an undesired parasitic capacitance on the collector of transistor 14.

FIG. 3 is a schematic diagram of the inventive differential amplifier including a gain reduction RC network which produces an equal parasitic capacitance on both collectors of input transistors 12 and 14 thus preserving the balanced nature of the amplifier. As can be seen, a first resistor 52 is coupled to the collector of input transistor 12 and a capacitor 54 is coupled in series between resistor 52 and the collector of input transistor 14. A resistor 56 has one end coupled to the collector of transistor 14 and a capacitor 58 is coupled in series between resistor 56 and the collector of transistor 12. If each of resistors 52 and 56 has a resistance twice that of resistor 32 in FIG. 1 and if each capacitor 54 and 58 has a capacitance ½ that of capacitor 30 in FIG. 1, then the total resistance and capacitance between the collectors of input transistors 12 and 14 remains unchanged.

FIG. 4 illustrates how the RC network shown in FIG. 3 may be implemented so as to produce substantially equal parasitic capacitances at the collectors of input transistors 12 and 14 which correspond to terminals 60 and 62 respectively in FIG. 4. Referring to FIG. 4, several epitaxial regions 64, 66, 68 and 70 are formed within a P-type substrate 72 coupled to ground. N+ regions 74 and 76 are diffused into epitaxial regions 64 and 70 respectively, and P-type regions 78 and 80 are diffused into epitaxial regions 66 and 68 respectively. An insulating layer 82 is deposited on the surface of the substrate and windows opened therein using well known techniques to provide contact windows to diffused regions 74, 76, 78 and 80. These windows are then filled with a contact metal, to make the required contacts such as is shown at 84, 86, 88, 90, 92, and 94. A layer of metal 96 (e.g. aluminum) is deposited on insulating layer 82 over N+ region 74. Similarly, a metal layer 98 is deposited on insulating layer 82 over diffused N+ layer 76.

Figure 5:
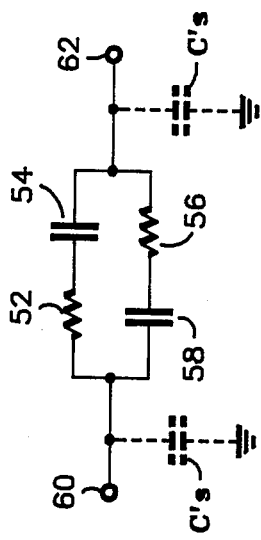
FIG. 5 is a schematic diagram of the device shown in FIG. 4 illustrating the parasitic capacitances created on both sides of the RC network.

Resistors 52 and 56 in FIG. 3 now comprise diffused regions 78 and 80 respectively. Capacitor 54 is comprised of diffused plate 74 and metal plate 96 while capacitor 58 is comprised of diffused plate 76 and metal plate 98. Diffused region 78 is coupled to terminal 60 via contact region 88 and to metal plate 96 via contact region 86. Diffused plate 74 is connected via contact material 84 to terminal 62 and, via contact material 90, to diffused region 80. Diffused region 80 is in turn connected via contact material 92 to metal plate 98. Finally, diffused plate 76 is coupled via contact region 94 to terminal 60. Thus, not only has an implementation been provided for the RC gain reduction circuitry shown in FIG. 3, but it has been provided in such a manner so as to provide substantially equal parasitic capacitances ($C_S'$) coupled between each terminal 60 and 62 (i.e. the collectors of transistor 12 and 14 in FIG. 3) and ground as shown in FIG. 5. Thus, the balanced nature of the amplifier has been preserved while providing the desired gain reduction network.

The above description is given by way of example only. Changes in form and details may be made by one skilled in the art without departing from the scope of the invention as defined by the appended claims.

I claim:

1. An RC circuit integrable in a semiconductor substrate, comprising:
   a first resistor diffused in said substrate and having first and second terminals;
   a second resistor diffused in said substrate and having first and second terminals;
   a first capacitor having a first diffused plate formed in said substrate and connected to the first terminal of said second resistor;
   a second capacitor having a first diffused plate formed in said substrate and connected to the second terminal of said first resistor;
   said first capacitor having a second plate comprised of a metal layer insulatingly disposed over the first diffused plate of said first capacitor and connected only to the first terminal of said first resistor; and
   said second capacitor having a second plate comprised of a metal layer insulatingly disposed over the first diffused plate of said second capacitor and connected only to the second terminal of said second resistor.

2. An RC circuit according to claim 1 wherein said first diffused plates of said first and second capacitors are formed in first and second epitaxial regions respectively.

3. An RC circuit according to claim 2 wherein said first and second resistors are formed in at least a third epitaxial region.

4. An RC circuit according to claim 3 wherein said first, second and said at least a third epitaxial region are of a first conductivity type, the first plates of said first and second capacitors are of said first conductivity type, and said first and second resistors are of a second conductivity type.

5. A monolithically integrable amplifier circuit manufactured in conjunction with a semiconductive substrate, comprising:
   first and second differentially coupled input transistors each having emitters for coupling to a first source of supply voltage, each having a base for coupling to first and second input signals respectively, and each having a collector;
   first and second load devices each having a first terminal coupled to the collector of one of said input transistors and a second terminal for coupling to a second source of supply voltage; and
   gain reduction means coupled between the collectors of said first and second input transistors, said gain reduction means comprising:
   a first resistor diffused in said substrate and having first and second terminals, said first terminal coupled to the collector of said first input transistor;
   a second resistor diffused in said substrate and having first and second terminals, said second terminal coupled to the collector of said second input transistor;
   a first capacitor having a first diffused plate formed in said substrate and connected to the collector of said first transistor;
   a second capacitor having a first diffused plate formed in said substrate and connected to the collector of said second transistor;
   said first capacitor having a second plate comprised of a metal layer insulatingly disposed over the first diffused plate of said first capacitor and connected to the first terminal of said second resistor; and said second capacitor having a second plate comprised of a metal layer insulatingly disposed over the first diffused plate of said second capacitor and connected to the second terminal of said first resistor.

6. A monolithically integrable amplifier circuit manufactured in conjunction with a semiconductor substrate, comprising:

first and second differentially coupled input transistors each having emitters for coupling to a first source of supply voltage, each having a base for coupling to first and second input signals respectively, and each having a collector;

first and second load devices each having a first terminal coupled to the collector of one of said input transistors and a second terminal for coupling to a second source of supply voltage; and gain reduction means coupled between the collectors of said first and second input transistors resulting in substantially equal parasitic capacitances at the collectors of said first and second input transistors.

* * * * *